May 17, 1966 J. A. CUNNINGHAM 3,251,259

SIGNAL GENERATOR

Filed Jan. 12, 1962

INVENTOR.
John A. Cunningham
BY
Charles H. Redman
Attorney.

United States Patent Office 3,251,259

Patented May 17, 1966

3,251,259

SIGNAL GENERATOR

John A. Cunningham, R.R. 1, Box 7, Batavia, Ill.

Filed Jan. 12, 1962, Ser. No. 165,817

3 Claims. (Cl. 84—457)

The present invention relates to improvements in signal generators and is more particularly concerned with the novel method of and means for controlling, with maximum accuracy, the frequency at which the generator will operate and to otherwise generally improve the construction thereof.

Signal generators have long been used but, because they or the tuning fork thereof is exposed to atmosphere, the responsiveness of the generator is effected to some degree by atmospheric conditions, such as the presence or absence of impurities in the atmosphere, the degree of humidity present, etc.

Applicant has overcome the objectionable characteristics arising from atmospheric contamination and humidity variations by enclosing the signal generator or tuning fork in a sealed glass envelope which has been evacuated to a maximum degree. This may be accomplished by evacuating the envelope to as low a pressure as possible, then release an inert 99.99% dry nitrogen to wash and purge the enclosed area of the greatest possible amount of oxygen and then evacuate further to the lowest possible pressure and then seal the envelope. A tuning fork enclosed in such a vacuum sealed envelope presents the problem of fine tuning which can be accomplished only after the envelope is sealed. It is therefore one of the advantages of the present invention to provide a novel envelope enclosed signal generator.

Another advantage of the present invention is the provision of novel means and structure within an evacuated envelope for electrically tuning the frequencies of a tuning fork enclosed therein.

Another object is to provide a signal generator with novel means for effecting a mechanical change in the vibrating frequencies of the tuning fork after the same has been sealed in its envelope.

Another object is to provide a signal generator with novel means for eliminating contamination of metal from out-gassing, oxidation, etc.

Another object is to provide an envelope enclosed signal generator that is visible at all times.

Another object is to provide a novel method for tuning the frequencies of a tuning fork sealed in an envelope.

The foregoing and other objects and advantages of the present invention will best be understood upon reference to the exemplary disclosure of a representative signal generator embodying features of the invention and shown in the accompanying drawings, in which.

Figures 1, 2, 3, 4, 5:
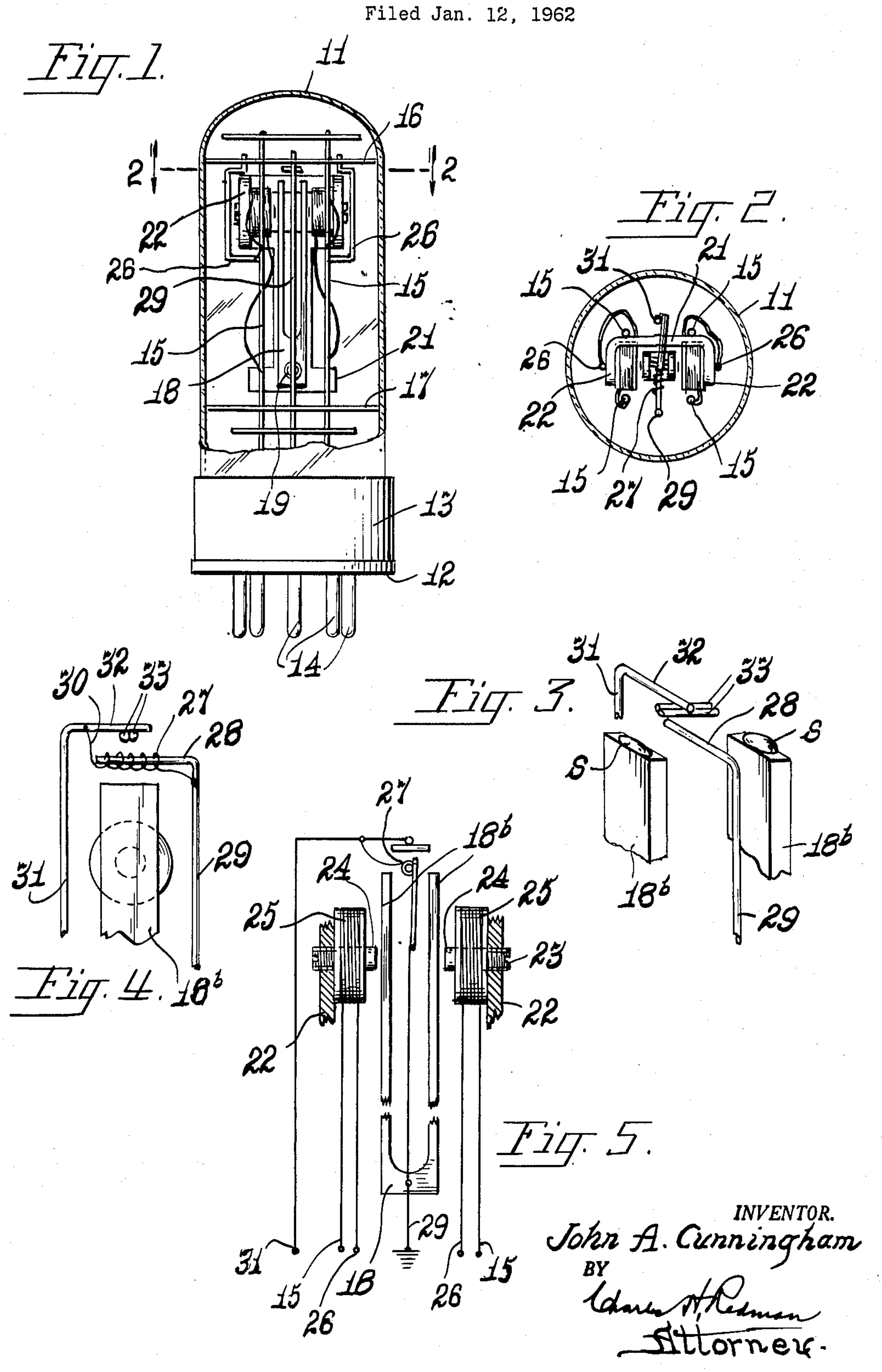
FIG. 1 is an elevational view of a signal generator embodying features of the invention, showing its glass envelope partially broken away.
FIG. 2 is a horizontal sectional view, taken substantially on line 2—2 of FIG. 1.
FIG. 3 is an enlarged schematic perspective view of the tines and silver application control elements.
FIG. 4 is a diagrammatic view showing parts in elevation and illustrating the electric wiring of the silver vaporizing coil.
FIG. 5 is a view similar to FIG. 4, viewing the assembly from a 90° angle with respect to FIG. 4, and showing parts in section.

Referring to the exemplary disclosure of the representative signal generator assembly best shown in FIG. 1, the signal generator and other components of the assembly are enclosed in a highly evacuated glass envelope 11 so as to minimide barometric influences and afford total visibility to the signal element or tuning fork and component parts at all times. Such visibility is a requisite in the present instance only at the time of fine tuning which is accomplished by the herein disclosed structure and assembly by the novel method of controlled transfer of exacting quantities of fusible metal, such as pure silver, to and from the terminal ends of the tines of the tuning fork so as to alter its vibrating frequency. The precise mode for accomplishing such critical tuning may vary in specific instances, but basically, it involves a structure and circuitry responding substantially to that now to be described.

Still referring to FIG. 1, the envelope 11, which enclosed the component parts of the signal generator and means for fine tuning of same, is sealed to provide a gas tight container which is mounted on a base 12 that may include a metal perimeter band 13. Conventional base pins 14 extend downwardly from the base and these are connected in the usual manner, electrically, with component parts of the signal generator and related components, all enclosed within the sealed envelope.

As shown, said assembly may include four equi-spaced support rods 15, that extend through upper and lower spacer shields 16, 17, respectively, and are connected one to each of four of the base pins 14.

One pair of said support rods 15 constitutes means for supporting tuning fork 18 in place. As illustrated, the fork, which includes a base portion and a pair of upstanding tines **18*b*, is secured, as by means of a screw 19, to a support plate 21 welded, soldered or otherwise secured firmly to the said pair of rods 15**.

As best shown in FIG. 2, the support plate 21, has its upper extremity terminate in a pair of spaced apart horizontally aligned wings 22 each having a threaded aperture therein (FIG. 5) each to receive threaded therein for adjustment the threaded end 23 of a core 24 of one of a pair of solenoids 25. The solenoid coils are connected, one terminal to one of each of the remaining pair of support rods 15, and their other terminals one to each of a pair of conductor rods 26 which are electrically connected one to each of the remaining base pins 14.

During operation and use of the signal generator, the tines of the tuning fork are put into oscillation by the flow of alternating current through solenoid coils 25. Because the entire assembly is sealed within envelope 11, novel electrically responsive means is incorporated into the structure for fine adjustment of the oscillation frequency of the tuning fork.

Referring more particularly to FIGS. 3 to 5, the assembly includes a suitable resistance material such as a tungsten wire 27 which is wrapped or otherwise wholly or partially coated with pure silver. This silver coated wire 27, constitutes a filament which is wound or coiled upon a horizontally extending rod-like portion 28 of a ground support post 29 and is electrically connected at one of its ends to said post. The other end of said filament 27 is connected by lead 30 to a support 31 also connected electrically to one of the base pins 14. The support 31 has its upper extremity extending substantially horizontally, as at 32, and it mounts a pair of electrodes 33 that are disposed at right angles to the plane of tines **18*b* and are spaced above the terminal ends of said tines with the silver loaded filament 27 and its support post 28** located between them.

Now, when the signal generator is placed in a test socket, a reading of the vibration frequencies of the tuning fork is obtained. Because the rate of vibration is critical, the vibration frequencies of the tuning fork have been adjusted as accurately as possible prior to its enclosure in the envelope by adjustment of screw cores 24. After the assembly is enclosed in the sealed envelope, it is no longer possible to re-adjust the screw cores to obtain fine adjustment, consequently applicant utilizes the silver on coil 27 to load the tines and subsequently, during continuous testing, intermittently add or remove minute quantities of said silver to or from the tines until a point is reached where the desired critical frequency cycle is obtained.

The foregoing frequency adjustment is effected by initially passing a low voltage current (about 6 to 8 volts) through support posts 31, coil 27 and ground 29. The tungsten coil 27 acts as a heater and when heated to a predetermined degree it causes the silver thereon to melt. As the heating increases, the silver vaporizes or "explodes" in the high vacuum and in so doing it is attracted to and accumulates on the terminal ends of the respective tines 18*b*, as shown at "S" in FIG. 3. The now overloaded tines are then subjected to charges of high voltage alternating current from 50,000 to 100,000 volts that bridges the gap between the tines and the electrodes 33. This high voltage current is of sufficient intensity and direction to cause molecules of the silver masses "S" on the tines to separate therefrom and accumulate on the electrodes. The high voltage charge is intermittently delivered to electrodes 33 while the operator is testing the signal generator and when the critical frequency cycle is obtained, the supply of current to said electrodes is cut off. The signal generator is now ready for use.

Although an exemplary embodiment of the invention has been disclosed in the accompanying drawings and described in detail in the foregoing specification, it is to be understood that the invention is capable of embodying various modifications in structural detail and that it is not intended to limit this invention except insofar as it is limited by the scope of the appended claims.

What I claim and desire to secure by Letters Patent of the United States is:

1. In a signal generator, the combination of, a sealed envelope, a tuning fork mounted in said envelope, driving means for vibrating the tuning fork, means making possible alteration of the operating frequency of the tuning fork by the application of heat and a high voltage current and which comprises, an electrode disposed in the envelope closely adjacent to the terminal ends of the tines of the tuning fork, a heater, a fusible metallic mass arranged on the heater between the electrode and the terminal ends of the tines, means extending through the envelope for connecting said heater with a low voltage current source whereby application of a low voltage current causes the mass to vaporize and be deposited on the tines of the tuning fork, and means extending through the envelope for connecting the electrode and tuning fork with a high voltage current source whereby application of a high voltage current to said electrode and tuning fork creates a discharge between the electrode and the tuning fork resulting in a transfer of metal from the tuning fork to the electrode and an increase in the tuning fork's frequency.

2. In a signal generator, the combination comprising a sealed envelope, a tuning fork, means mounting said tuning fork within said envelope, driving means for vibrating the tuning fork, an electrode mounted within said envelope and having its terminal closely spaced from the tines of said tuning fork, means providing external electrical connections to said electrode and to the tuning fork, a metallic mass carried between said electrode and tuning fork tines, means to vaporize said mass to afford a transfer of said mass to the tines of the tuning fork, and high voltage means to transfer said mass from the tines to the electrode.

3. The signal generator of claim 2, in which the metallic body consists of a fusible coating on a coil of fine gauge wire.

References Cited by the Examiner

UNITED STATES PATENTS

| | | | |
|---|---|---|---|
| 2,816,239 | 12/1957 | Berge | 310—8.9 X |
| 2,928,308 | 3/1960 | Godbey | 331—156 X |

LOUIS J. CAPOZI, *Primary Examiner.*

JOHN W. HUCKERT, C. O. GARDNER, *Assistant Examiners.*